US006954397B2

(12) United States Patent
Marshall

(10) Patent No.: US 6,954,397 B2

(45) Date of Patent: Oct. 11, 2005

(54) CIRCUIT FOR REDUCING STANDBY LEAKAGE IN A MEMORY UNIT

(75) Inventor: Andrew Marshall, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/626,438

(22) Filed: Jul. 24, 2003

(65) Prior Publication Data

US 2005/0018520 A1 Jan. 27, 2005

(51) Int. Cl.[7] .................................................. G11C 7/00

(52) U.S. Cl. ...................................................... 365/229

(58) Field of Search ................................ 365/226, 229, 365/228, 149, 189.09

(56) References Cited

U.S. PATENT DOCUMENTS 4,404,662 A * 9/1983 Masenas, Jr. ............... 365/203

5,610,852 A * 3/1997 Koike et al. ................ 365/145

5,684,751 A * 11/1997 Manning .................... 365/222

* cited by examiner

*Primary Examiner*—Thong Q. Le

(74) *Attorney, Agent, or Firm*—Alan K. Stewart; W. James Brady, III; Frederick J. Telecky, Jr.

(57) ABSTRACT

A circuit for reducing standby leakage in a memory unit contains a capacitive divider coupled to the memory unit so as to generate a voltage across the memory unit, which is adequate to retain memory values during one of a sleep state and a standby state. An inductive circuit for reducing standby leakage in a memory unit includes an inductive divider coupled to the memory unit so as to generate a voltage across the memory unit, which is adequate to retain memory values during one of a sleep state and a standby state.

12 Claims, 3 Drawing Sheets

CIRCUIT FOR REDUCING STANDBY LEAKAGE IN A MEMORY UNIT

FIELD OF THE INVENTION

The present invention generally relates to the reduction of standby power in memory units and more particularly relates to reducing standby leakage in memory units such as a static random access memory (SRAM).

BACKGROUND OF THE INVENTION

Many electronic devices such as mobile phones and personal digital assistants (PDAs) are operated by battery power supplies and use SRAMs for data memory.

Recently, it has become important to place circuitry into a deep-sleep mode to minimize circuit leakage. Some circuitry may be switched-off completely using series switches, but volatile memory devices, such as SRAM, that need to retain their contents cannot use that technique, since they lose their data if power is completely removed.

Therefore, to reduce the leakage of memory devices during the standby state, it has been proposed to reduce the voltage across the memory cell, as shown in FIG. 1. The problem encountered when doing this is that the reduced voltage across the SRAM cell has to be generated by a low drop-out (LDO) voltage supply, which requires operating current, and dissipated power equivalent to the leakage multiplied by the voltage between the supply voltage and standby voltage.

Alternatively, a passive series regulator can be used which dissipates dissipated power equivalent to the leakage multiplied by the voltage between the supply voltage and standby voltage, and may not produce a very consistent low voltage supply.

Therefore, a need exists to provide a solution, that minimizes power dissipation in SRAMs and other memory types during the sleep state, that eliminates the need for a LDO in sleep mode.

Accordingly, what is needed is an on-chip solution that requires lowest power and permits the entire memory to retain the same voltage supplies.

Therefore, a need exists to overcome the problems with the prior art as discussed above.

SUMMARY OF THE INVENTION

According to one aspect of the present invention, a circuit for reducing standby leakage in a memory unit contains a capacitive divider coupled to the memory unit so as to generate a voltage across the memory unit, which is adequate to retain memory values during a sleep state and a standby state.

According to another aspect of the present invention, an inductive circuit for reducing standby leakage in a memory unit includes an inductive divider coupled to the memory unit so as to generate a voltage across the memory unit, which is adequate to retain memory values during a sleep state and a standby state.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings in which like reference numerals designate like parts throughout the figures thereof and wherein.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION

Reference throughout the specification to "one embodiment" means that a particular feature, structure, or characteristic described in connection with the embodiment is included in at least one embodiment of the present invention. Thus, the appearances of the phrases "in one embodiment" in various places throughout the specification are not necessarily all referring to the same embodiment. Furthermore, the particular features, structures, or characteristics may be combined in any suitable manner in one or more embodiments. Moreover, these embodiments are only examples of the many advantageous uses of the innovative teachings herein. In general, statements made in the specification of the present application do not necessarily limit any of the various claimed inventions. Moreover, some statements may apply to some inventive features, but not to others. In general, unless otherwise indicated, singular elements may be in the plural and vice versa with no loss of generality.

The scope of the present invention in its many embodiments is defined in the appended claims. Nonetheless, the invention and its many features may be more fully appreciated in the context of exemplary implementations disclosed and described herein which combine one or more embodiments of the invention with other concepts, architectures, circuits, and structures to achieve higher performance than previously achievable.

The present invention, according to one embodiment, overcomes problems of the prior art by minimizing power dissipation in SRAMs and other memory types during the sleep state, and by avoiding the need for a LDO in the sleep mode.

Implementation Embodiment in Hardware

Figure 1:
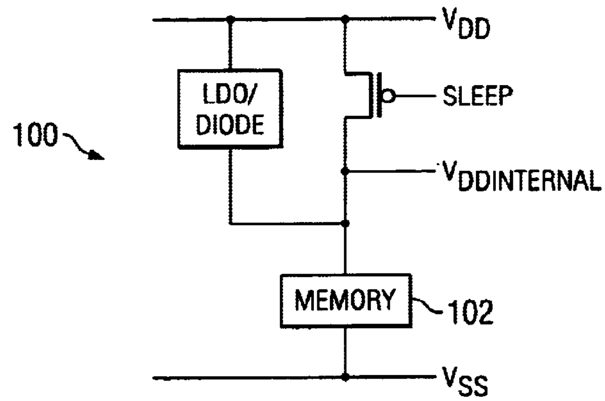
FIG. 1 is a schematic and block diagram illustrating a conventional circuit for reducing the voltage across a memory unit during sleep mode using a low drop-out voltage supply.
Figure 2:
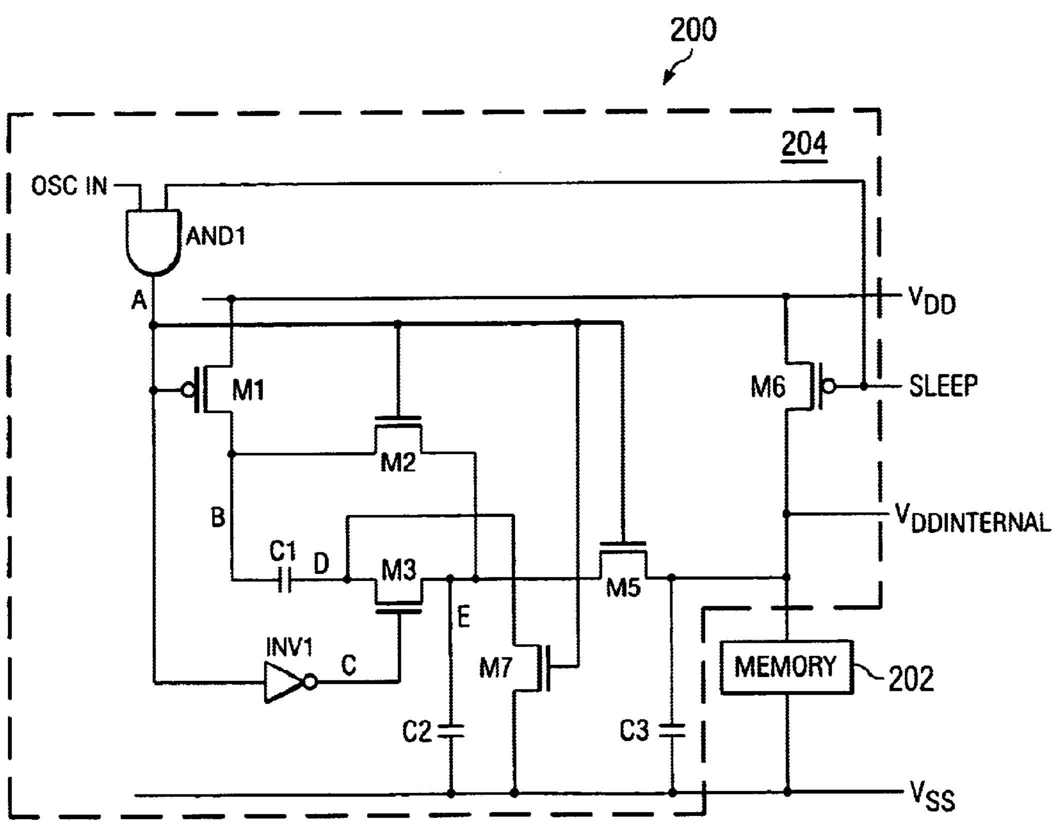
FIG. 2 is a schematic and block diagram of a circuit having a memory unit connected to a capacitive divider in a low current standby state, according to one embodiment of the present invention.

FIG. 2 is a schematic and block diagram of a circuit 200 having a memory unit 202 connected to a capacitive divider 204 in a low current standby state, according to one embodiment of the present invention. Accordingly, the memory unit 202 is not driven in the standby state by an LDO or a series regulator, but by a capacitor divider 204 that generates a division of Vdd such as Vdd/2, Vdd/3, Vdd/4 and so on. In an embodiment, the capacitive divider 204 is coupled to the memory unit 202 through a non-illustrated substrate (on-chip).

It is assumed that the 'osc in' runs continuously as a square wave of approximately 1–100 MHz, although the oscillator may be off when not in the sleep or standby mode. In one embodiment, the capacitive divider 204 is configured for varying an oscillator frequency in accordance with the generated voltage so as to minimize switching losses.

Operational State

The 'sleep' input is LOW during normal operation, which switches the transistor M6 on, and raises the Vddinternal voltage to be close to Vdd. During this time period, the voltage at node 'A' is 0 volts (LOW), which turns on the transistor M1, and raises the voltage at node B to be close to Vdd. Since the node A is LOW, M5 will be off, thereby providing a high impedance to the Vddinternal voltage. Further, since the node A is LOW, the transistor M7 will be off, which provides a high impedance from the node D to Vss.

Now, since the node A is HIGH (as the input to the inverter INV1), the node C is HIGH, which turns on the transistor M3. Capacitors C1 and C2 are of the same size or approximately the same size. Thus, in a transient switching, the capacitors C1 and C2 will have approximately equal charges, causing a voltage (at the node D) of approximately Vdd/2. If the operational state is maintained for a long period of time, the voltage at the node D may drift due to leakage. However, that is not important in this case.

Standby State

In the standby state, the voltage on the 'sleep' node is raised to Vdd, thereby turning off the transistor M6. The oscillator osc toggles between Vss (LOW) and Vdd (HIGH). When the 'osc in' is LOW, the voltage at the node 'A' is 0 volts, which turns on the transistor M1, and raises the voltage at the node B to be close to Vdd. Since the node A is LOW, the transistor M5 will be off, thereby providing a high impedance to Vddinternal. Since the node A is LOW, the transistor M7 will be off, which provides a high impedance from the node D to Vss.

Moreover, since the node A is HIGH (as the input to inverter INV1), the node C is HIGH, which turns on the transistor M3. The capacitors C1 and C2 are of the same size or of approximately the same size. Thus, in a transient switching, the capacitors C1 and C2 will have approximately equal charges, thereby creating a voltage at the node D, which is approximately Vdd/2 in magnitude. Therefore, the capacitor C1 has Vdd/2 across it (Vdd at the node B and Vdd/2 at the node D), and the capacitor C2 also has Vdd/2 across it (Vdd/2 at the node D and 0 volts at Vss).

As the oscillator switches to HIGH, the node A switches to HIGH, thereby turning off the transistor M1. Further, through the inversion of the inverter INV1, the voltage at node C is switched to zero volts, and the transistor M3 is turned off. Meanwhile, the raising of the voltage on the node A turns on the transistor M7, which switches the voltage at the node D down to zero volts (from Vdd/2). Due to capacitive charge conservation, the voltage at the node B is pulled down to Vdd/2. At this point, both of the nodes B and E have a voltage of Vdd/2.

Furthermore, the HIGH voltage on the node A turns on the transistor M2, which shorts the nodes B and E. This combination of stored charge is available to the standby-state memory 202 through the transistor M5, which is on. A capacitor C3 serves as a storage capacitor to continue providing current to the memory 202 during the charging part of the cycle for the capacitors C1 and C2.

Although it is shown that the memory unit 202 is coupled between Vss and Vddinternal terminals, in other embodiments, the memory unit 202 may be coupled between Vss and Vddinternal terminals. Alternatively, the memory unit 202 may also be coupled between a first Vddinternal and a second Vddinternal terminal operating at a different potential.

Figure 3:
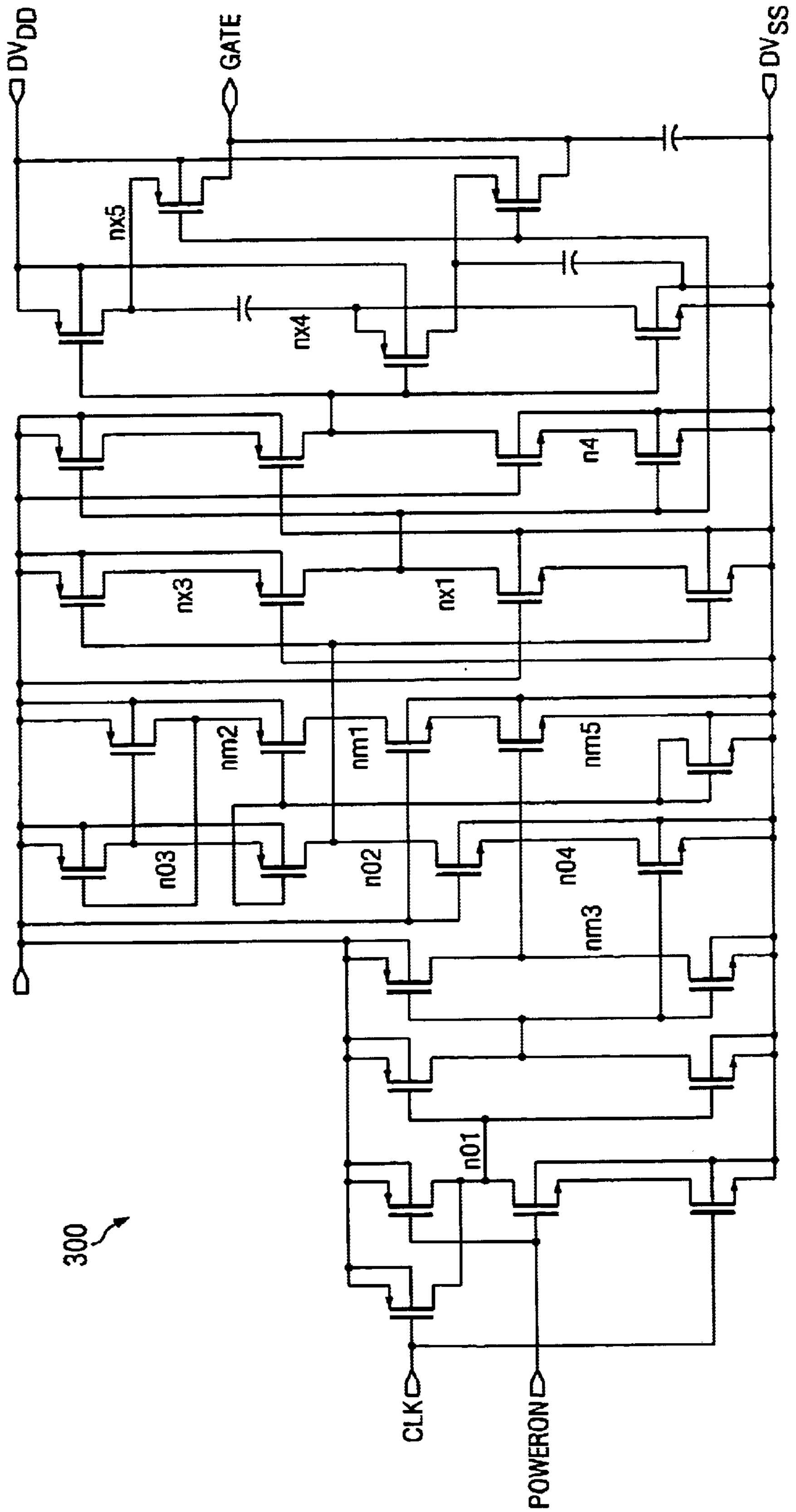
FIG. 3 is a schematic diagram of a circuit illustrating a voltage pump portion of a SRAM standby configuration, according to an embodiment of the present invention.

FIG. 3 is a schematic diagram of a circuit illustrating a voltage pump portion of a SRAM standby configuration, according to an embodiment of the present invention. The circuit configuration 300 is included in the x1825 test chip. The circuit 300 contains a clock and control input, but does not include the memory or the top-right PMOS of FIG. 2, which is present only for 'operational' mode.

The circuit configuration 300 is included on the x1825 test-chip to verify SPICE simulation and capability. The circuit configuration 300 includes several stages of cascoded inverters. However, these components may be non-cascoded. For the sake of clarity and simplicity, further details of FIG. 3 are not included hereinafter.

SPICE Simulation Results

Figure 4:
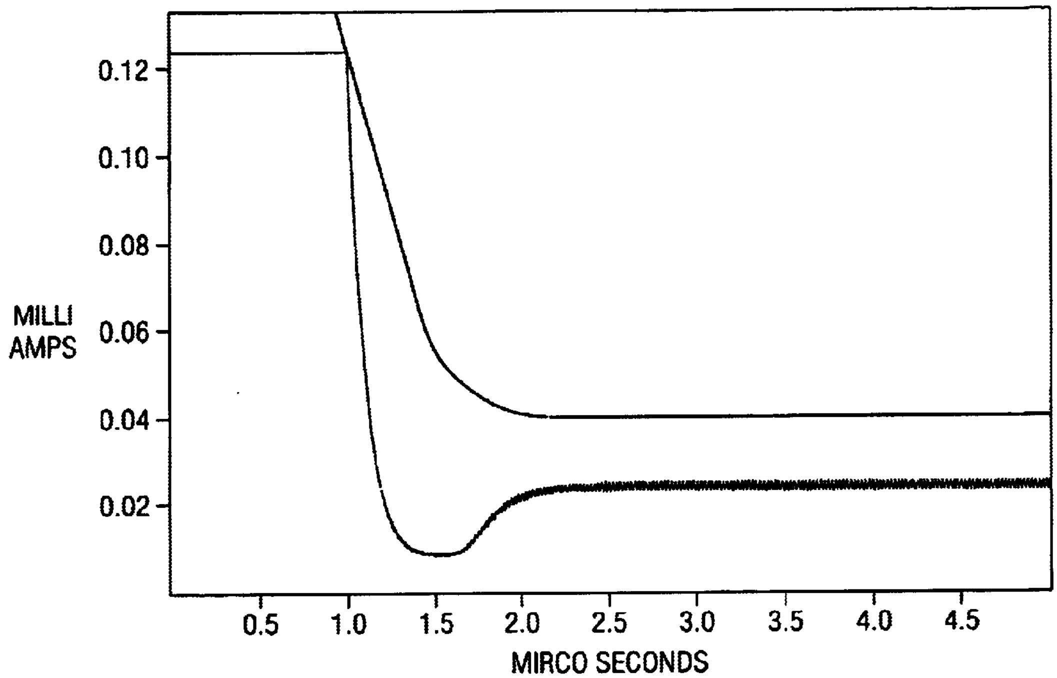
FIG. 4 is a graph showing SPICE simulation results of standby currents for: (i) a conventional linear regulator (upper curve) and (ii) the circuit of the present invention (lower curve).

Turning now to FIG. 4, there are shown the SPICE simulation results for current consumption for: (i) the present invention and (ii) a conventional linear regulator under operating and standby conditions. The upper signal (curve) represents the SRAM current of the conventional standby configuration—that is, the current through the SRAM, but not including any additional regulator current required. The lower signal (curve) represents the current consumed by the capacitive voltage divider of the present invention, and includes the SRAM current. This shows that, in this configuration of the present invention, which has not yet been optimized for efficiency, a 40% reduction in current (and, thus standby power) is achieved.

Inductive Voltage Divider Embodiment

Another embodiment of the present invention for providing a high efficiency voltage division at any required voltage is an inductive voltage divider, such as a Buck Regulator configuration.

Figure 5:
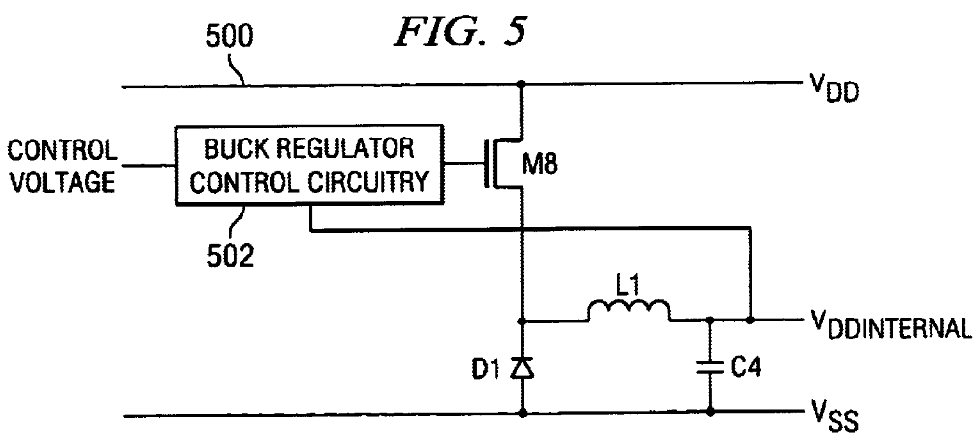
FIG. 5 is a schematic and block diagram illustrating an inductive voltage divider, according to one embodiment of the present invention.

FIG. 5 shows an inductive voltage divider 500 in accordance with the present invention. In an embodiment, the inductive voltage divider 500 is coupled to the memory unit through a non-illustrated substrate (on-chip).

The mode of operation of the inductive voltage divider 500 is described below.

Operation

Still referring to FIG. 5, initially, the transistor M8 switches on. During this time, the inductor L1 conducts current. At a time determined by the buck regulator control circuitry 502, the transistor M8 turns off. However, current continues to flow in the inductor L1, thereby forcing the voltage at the cathode of the diode D1 to below Vss, and turning on the diode D1. Further, at a time decided by the Buck regulator control circuitry 502, the transistor M8 turns on again and begins to charge the inductor L1. Capacitor C4 stabilizes the vddinternal voltage. The feedback from Vddinternal to the control circuitry 502 permits the maintenance of the Vddinternal voltage at the required level for "memory retention" in the standby mode.

Accordingly, by using the present invention, the power of the internal rail that would otherwise be dissipated (i.e., wasted) as I*(Vdd−Vinternal) is conserved. This saves approximately 50% of the power required by a conventional regulator (66% for a Vdd/3), but does require a small amount of switching power, which can be minimized using an intelligent control circuitry to return the supply voltage to the required level only when required.

Thus, a savings of approximately 50% of the power required by a conventional regulator is expected, before accounting for any losses of the divider circuit. Switching and resistive losses may reduce this gain.

Advantageously, the present invention provides for the minimum power dissipation in SRAM and other memory types during the sleep state, eliminates the need for a LDO in the sleep mode. Further, improved voltage tracking may be achieved as compared with series regulation.

Non-Limiting Embodiments

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

In view of the above, it can be seen the present invention presents a significant advancement in the art of reduction of standby power in memory units. Further, this invention has been described in considerable detail in order to provide those skilled in the art with the information needed to apply the novel principles and to construct and use such specialized components as are required. In view of the foregoing descriptions, it should further be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow. For example, although various embodiments have been presented herein with reference to particular transistor types, the present inventive structures and characteristics are not necessarily limited to particular transistor types or sets of characteristics as used herein.

What is claimed is:

1. A circuit for reducing standby leakage in a memory unit, comprising:

a capacitive divider coupled to the memory unit so as to generate a voltage across the memory unit, the voltage being adequate to retain memory values during one of a sleep state and a standby state, wherein the memory unit is coupled between Vss and Vddinternal terminals.

2. The circuit according to claim 1, wherein said capacitive divider is coupled to the memory unit on-chip.

3. The circuit according to claim 1, wherein the voltage is a division of a normal operating voltage.

4. The circuit according to claim 3, wherein the voltage is substantially Vdd/2.

5. The circuit according to claim 3, wherein the voltage is substantially Vdd/3.

6. The circuit according to claim 1, wherein said capacitive divider is configured for varying an oscillator frequency in accordance with the generated voltage so as to minimize switching losses.

7. An inductive circuit for reducing standby leakage in a memory unit, comprising:

an inductive divider coupled to the memory unit so as to generate a voltage across the memory unit, the voltage being adequate to retain memory values during one of a sleep state and a standby state, wherein the memory unit is coupled between Vss and Vddinternal terminals.

8. The inductive circuit according to claim 7, wherein said inductive divider is coupled to the memory unit on-chip.

9. The inductive circuit according to claim 7, wherein the voltage is a division of a normal operating voltage.

10. The inductive circuit according to claim 9, wherein the voltage is substantially Vdd/2.

11. The inductive circuit according to claim 9, wherein the voltage is substantially Vdd/3.

12. The inductive circuit according to claim 7, wherein said inductive divider is configured for varying an oscillator frequency in accordance with the generated voltage so as to minimize switching losses.

* * * * *